United States Patent [19]

Inoue et al.

[11] Patent Number: 5,389,818
[45] Date of Patent: Feb. 14, 1995

[54] LEAD FRAME

[75] Inventors: Shuji Inoue; Yasuhiko Hiraki, both of Ibaragi, Japan

[73] Assignee: Intel Corporation, Santa Clara, Calif.

[21] Appl. No.: 144,208

[22] Filed: Oct. 27, 1993

[30] Foreign Application Priority Data

Mar. 17, 1993 [JP] Japan .................... 5-081089

[51] Int. Cl.6 .................. H01L 23/48; H01L 29/44; H01L 29/52; H01L 29/60
[52] U.S. Cl. .................... 257/676; 257/666
[58] Field of Search .................. 257/666, 676

[56] References Cited
FOREIGN PATENT DOCUMENTS

| | | | |
|---|---|---|---|
| 55-1195 | 5/1979 | Japan .................... | 257/676 |
| 56-24959 | 3/1981 | Japan .................... | 257/675 |

*Primary Examiner*—Andrew J. James
*Assistant Examiner*—S. V. Clark
*Attorney, Agent, or Firm*—Blakely, Sokoloff, Taylor & Zafman

[57] ABSTRACT

A lead frame includes a stage portion, at least one bar-like support portion, a plurality of lead portions; and a connection portion. A semiconductor chip having pads formed on an upper surface of the semiconductor chip is mounted on the stage portion. The bar-like support portion supports the stage portion. The plurality of lead portions are arranged to surround the stage portion and connected to the pads of the semiconductor chip mounted on the stage portion, and the stage portion is arranged at a level lower than that of an arrangement surface of the lead portions. The connection portion is formed on one side of the stage portion perpendicular to a longitudinal direction of the support portion, and the connection portion has a central portion which has an upper side portion projecting almost parallelly to a surface of the stage portion at a level higher than that of the surface of the stage portion and is connected to the support portion on the same plane.

7 Claims, 4 Drawing Sheets

5,389,818

LEAD FRAME

BACKGROUND OF THE INVENTION

The present invention relates to a lead frame and, more particularly, to a lead frame in which a stage portion for mounting a semiconductor chip thereon is arranged at a level lower than that of the arrangement surface of lead portions.

In a lead frame used in the step of assembling a semiconductor chip, the pads of the semiconductor chip mounted on a stage portion and lead portions for electrically connecting the semiconductor chip to an external circuit are connected to each other by a wire bonding scheme in which wires are individually bonded. In place of the wiring bonding scheme, in recent years, bonding using a TAB (Tape Automated Bonding) tape has been performed.

FIG. 4 shows a conventional lead frame and particularly shows a part corresponding to one semiconductor chip, and FIG. 5 shows a part of a conventional lead frame bonded using a TAB tape when viewed from a side direction of the semiconductor chip. Referring to FIG. 4, reference numeral 20 denotes each of long guides for holding an entire lead frame; 21, a stage portion for mounting a semiconductor chip thereon; and 22, a pair of bar-like support portions, integrated with the stage portion 21, for fixing the position of the stage portion 21. Each of the support portions 22 is constituted by a support bar for only fixing the stage portion 21, a ground lead used for, in addition to fixing the stage portion 21, connection to the ground pad of a semiconductor chip, or the like. Reference numeral 25 denotes each of a plurality of leads connected to the pads of the semiconductor chip, and reference numeral 29 denotes each of tie bars for connecting the lead portions 25 to each other to fix them. The above portions are integrally formed by punching out a thin metal plate.

Referring to FIG. 5, reference numeral 6 denotes a semiconductor chip; 27, a plurality of leads of a TAB tape; 27a, inner lead portions of the leads 27 connected to the pads of the semiconductor chip 6; 27b, outer lead portions of the leads 27 connected to lead portions 25 of the lead frame; and 28, support films, e.g., each consisting of a polyimide film, of the TAB tape. The plurality of leads 27 are adhesively held by the support films 28.

In the lead frame in FIG. 4, the stage portion 21 is fixed to the guides 20 by the support portions 22, and the larger number of lead portions 25 arranged to surround the stage portion 21 are bound by the tie bars 29 and fixed to the guides 20. Some of the lead portions 25 are obliquely formed, i.e., have crank-like shapes. At a portion where the arrangement of the lead portions 25 is shifted from the arrangement of the pads of the semiconductor chip 6, the crank-like lead portions are necessary. When a degree of integration of the semiconductor chip 6 is increased to increase the number of pins extracted from the semiconductor substrate 6, necessity for the crank-like lead portions is further increased. A plurality of crank-like lead frames are generally connected to each other, and the crank-like lead frames are separated from each other after mounting the semiconductor chips 6, connection using the TAB tapes, processing such as resin sealing, or the like.

As shown in FIG. 5, when bonding is to be performed to the lead frame using a TAB tape, pads 6a formed on the upper surface of the semiconductor chip 6 mounted on the stage portion 21 of the lead frame are connected to the inner lead portions 27a, respectively, and the lead portions 25 of the lead frame are simultaneously connected to the outer lead portions 27b, respectively. That is, simultaneous bonding can be performed. The stage portion 21 is fixed at the same level as that of the arrangement surface of the lead portions 25 by the support portions 22. That is, the lead frame is formed such that all the portions of the lead frame are formed at the same level. For this reason, in order to connect the leads 27 to the lead portions 25 of the lead frame, the leads 27 of the TAB tape must be bent such that the level of the outer lead portions 27b is lower than that of the inner lead portions 27a by the thickness of the semiconductor chip 6. When the leads 27 are bent by an amount of the thickness of the semiconductor chip 6, this bending operation may cause positional errors in the outer lead portions 27b. In this case, the positional errors of the outer lead portions 27b make accurate positioning of the outer lead portions 27b very difficult during bonding, thereby disabling the simultaneous bonding.

In order to solve the above problem, the following scheme is considered. That is, the stage portion of the lead frame is arranged at a level lower than that of the arrangement surface of the lead portions to cause the leads of the TAB tape to be slightly bend downward. FIG. 6 shows a part of a conventional lead frame in which a stage portion is arranged at a level lower than that of the arrangement surface of lead portions when viewed from a side direction of the semiconductor chip, and FIG. 7 shows the portion of the lead frame when viewed from the upper direction of the semiconductor ship.

Referring to FIG. 6, reference numeral 31 denotes a stage portion of the lead frame for mounting a semiconductor chip 6; 32, a bar-like support portion for supporting the stage portion 31; 35, a lead portion; 37, a lead of a TAB tape; 37a, an outer lead portion of the lead 37 of the TAB tape; and 38, a support film of the TAB tape. Reference symbol t1 denotes the thickness of the stage portion 31, and reference symbol t3 denotes the thickness of the bent portion of the support portion 32. Note that the thickness of the portion of the support portion 32 except for the bent portion and the thickness of the lead portions 35 are t1.

Referring to FIG. 7, reference numeral 32a denotes the support portion after a positional error caused by bending the support portion 32 downward, and reference numeral 39 denotes a tie bar.

In this lead frame, as shown in FIG. 6, the support portion 32 having one end connected to the stage portion 31 is bent downward to arrange the stage portion 31 at a level lower than that of the arrangement surface of the lead portion 35, thereby preventing the outer lead portion 37b of the lead 37 of the TAB tape from being bent. However, in this prior art, when the support portion 32 is bent downward, a drawing phenomenon in which the thickness t3 of the bent portion of the support portion 32 is smaller than the thickness t1 of other portions of the lead frame such as the stage portion 31 occurs. Since the degree of this phenomenon varies depending on each support portion 32 connected to the stage portion 31, the stage portion 31 connected to the support portion 32 may be inclined, or a positional error may occur in the stage portion 31. As a result, the positional relationship between the pads of the semiconductor chip 6 and the lead portions 35 of the lead frame is vertically or horizontally shifted.

As shown in FIG. 7, when a part of each of the crank-shaped support portions 32 having one end connected to the stage portion 31 is bent downward, a drawing phenomenon in which the support portion 32 is shifted in the lateral directions (horizontal directions) occurs. That is, since the other end of each of the support portions 32 is connected and fixed to the tie bar 39, a force acts on the support portion 32 such that the support portion 32 is shifted to the position of the support portion 32a indicated by an alternate long and short dashed line in FIG. 7 using the connection portion between the support portion 32 and the tie bar 39 as a support. When the force shifts the support portion 32 to the position denoted by the reference numeral 32a, especially when the support portion 32 is used as a ground lead, a positional error occurs between the ground pad of the semiconductor chip 6 and the bonding portion of the ground lead (support portion 32) to be connected to the ground pad through the TAB tape.

The conventional lead frame is arranged as described above. For this reason, when the crank-like support portion is bent downward to arrange the stage portion of the lead frame at a level lower than that of the arrangement surface of the lead portions, the support portion is shifted in the directions (horizontal directions) perpendicular to the extending direction of the support portion. Therefore, when the support portion is used as a ground lead, a positional error occurs between the ground pad of the semiconductor chip 6 and the bonding portion of the ground lead (support portion) to be connected to the ground pad through the TAB tape. As a result, a problem, i.e., simultaneous bonding by the TAB tape becomes difficult, is posed. In addition, the positional error of the support portion may cause the support portion to be brought into contact with the lead portion adjacent to the support portion.

SUMMARY OF THE INVENTION

It is an object of the present invention to provide a lead frame in which, when a stage portion is arranged at a level lower than that of an arrangement surface of lead portions, a positional error does not occur in a support portion.

In order to achieve the above objects, according to the present invention, there is provided a lead frame comprising, a stage portion on which a semiconductor chip having pads formed on an upper surface of the semiconductor chip is mounted, at least one bar-like support portion for supporting the stage portion, a plurality of lead portions arranged to surround the stage portion and connected to the pads of the semiconductor chip mounted on the stage portion, the stage portion being arranged at a level lower than that of an arrangement surface of the lead portions, and a connection portion formed on one side of the stage portion perpendicular to a longitudinal direction of the support portion, the connection portion having a central portion which has an upper side portion projecting almost parallelly to a surface of the stage portion at a level higher than that of the surface of the stage portion and is connected to the support portion on the same plane.

DESCRIPTION OF THE PREFERRED EMBODIMENTS

Figure 1A:
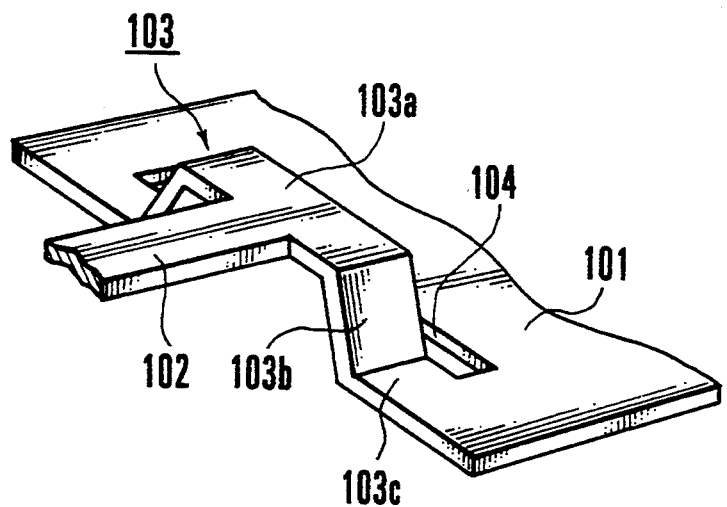
FIG. 1A is a perspective view showing a connection portion of a lead frame according to an embodiment of the present invention.
Figure 1B:
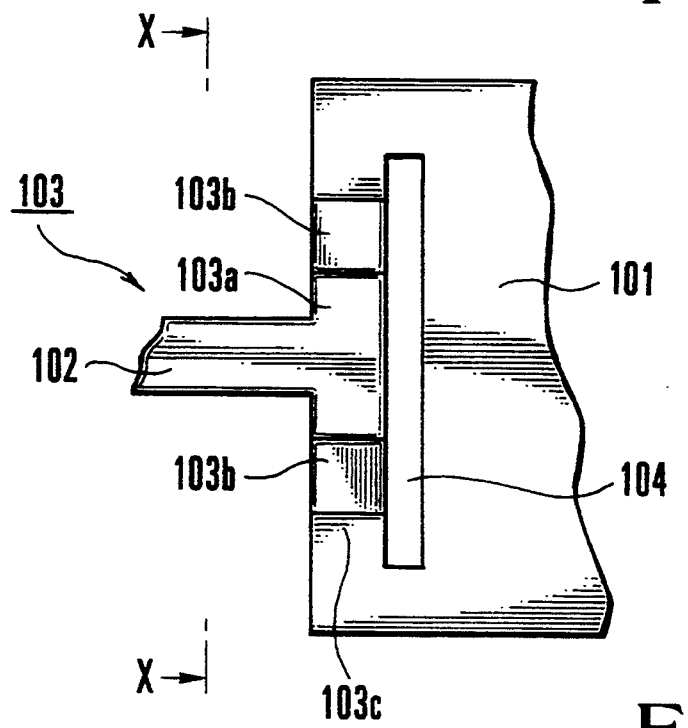
FIG. 1B is a plan view showing the connection portion in FIG. 1A.
Figure 1C:
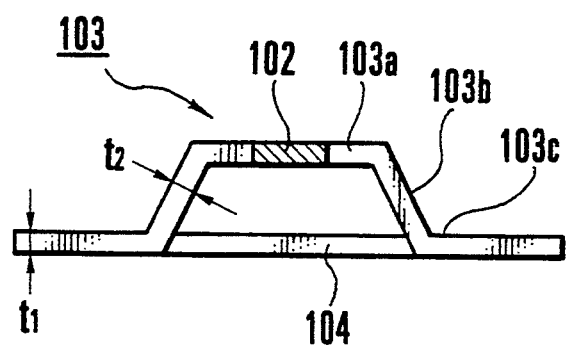
FIG. 1C is a sectional view showing the connection portion along an X—X line in FIG. 1B.

FIG. 1A shows a connection portion of a lead frame according to an embodiment of the present invention, FIG. 1B shows the connection portion when viewed from the upper direction, and FIG. 1C shows the connection portion along an X—X line in FIG. 1B. Reference numeral 101 denotes a stage portion of the lead frame; 102, a bar-like support portion formed parallelly to the stage portion 101; and 103, a connection portion formed at an edge of the stage portion 101, i.e., the peripheral portion of the stage portion 101. The connection portion 103 is separated from the stage portion 101 by a cut portion 104 formed at the outer peripheral portion of the stage portion 101 and extending in a predetermined direction perpendicular to the longitudinal direction of the support portion 102. For this reason, the connection portion 103 has a rectangular shape having two long sides extending in the predetermined direction. Both the ends of the connection portion 103 in the predetermined direction are formed integrally with the stage portion 101. That is, the connection portion 103 is formed such that the slit-like cut portion 104 is punched along the predetermined direction at a position slightly inside the stage portion 101 almost near the edge of the stage portion 101. The connection portion 103 is formed such that its central portion is formed as an upper side portion 103a at a level higher than that of the surface of the stage portion 101.

As is apparent from FIGS. 1A and 1C, the connection portion 103 is formed in a trapezoidal shape when viewed from a side surface of the connection portion 103, and the connection portion 103 is constituted by the upper side portion 103a parallel to the surface of the stage portion 101 and set at a level higher than that of the surface, oblique side portions 103b bent to form the upper side portion 103a at a level higher than that of the stage portion 101, and bottom side portions 103c formed between the oblique side portions 103b and the stage portion 101. Reference symbol t1 denotes the thickness of the lead frame including the stage portion 101, and reference symbol t2 denotes each of the oblique side portions 103b of the connection portion 103. One end of the support portion 102 is connected to the central portion of the upper side portion 103a. The upper side portion 103a and the support portion 102 are naturally formed on the same plane. The stage portion 101 and the connection portion 103 are integrally formed together with the support portion 102 by performing press processing to a thin metal plate. Note that the cut portion 104 may be formed simultaneously with the press processing, or may be formed by punch-through processing in the previous step.

In the lead frame arranged as described above, the stage portion 101 is integrally connected to one end of the support portion 102 through the connection portion 103, the other end of the support portion 102 is connected to a tie bar (not shown) or the like, and the tie bar, the support portion 102, and lead portions are formed on the same plane. For this reason, the stage portion 101 is arranged at a level lower than that of the arrangement of the lead portions. When the inclination angle of the oblique side portion 103b of the connection portion 103 is adjusted, an amount by which the stage portion 101 is lowered with respect to the arrangement surface of the lead portions can be set to be an arbitrary amount depending on the thickness of the semiconductor chip to be mounted. It is desirable to increase the length of the connection portion 103 in accordance with the increase in this amount. In this embodiment, although the slit-like cut portion 104 is formed, it is satisfactory to cut the portion without forming a slit having a predetermined width.

In this embodiment, as shown in FIG. 1C, the thickness t2 of each of the oblique side portions 103b of the connection portion 103 may be smaller than the thickness t1 of other portions of the lead frame such as the stage portion 101, i.e., a drawing phenomenon may occur in the oblique side portions 103b. However, this phenomenon does not adversely affect the support portion 102 at all. In addition, the influence of the phenomenon to the stage portion 101 connected to the connection portion 103 can be almost negligible.

More specifically, although the connection portions between the stage portion 101 and both the end portions of the connection portion 103 are drawn, the stage portion 101 is not shifted in its surface directions (horizontal directions) because the connection portions are drawn from both the directions. In addition, the size of the connection portion 103 is considerably smaller than that of the stage portion 101, the influence of the connection portion 103 on the stage portion 101 can be substantially negligible. Therefore, the horizontal position of the stage portion 101 with respect to the support portion 102 is not changed. For this reason, even when the crank-like support portion 102 is used, horizontal and vertical positional errors do not occur in the stage portion 101, and no positional error occurs in the support portion 102, thereby easily performing simultaneous bonding.

Figure 2:
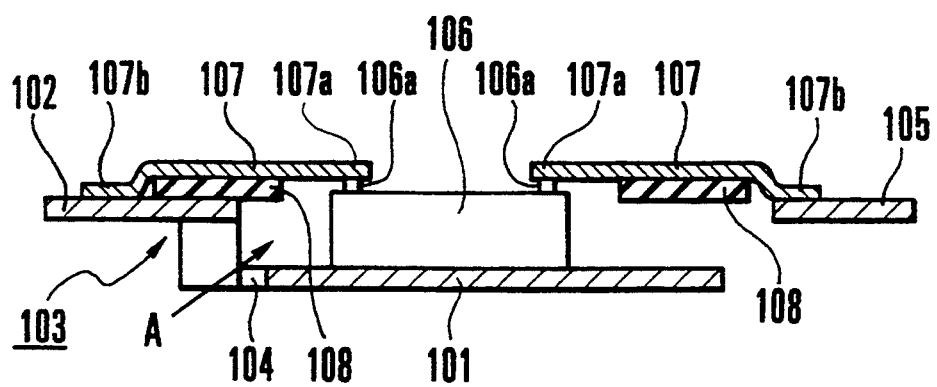
FIG. 2 is a sectional view showing a main part of the lead frame, shown in FIGS. 1A, 1B, and 1C, on which a semiconductor chip is mounted when viewed from a side direction of the semiconductor chip.

FIG. 2 shows a main part of the lead frame, on which a semiconductor chip is mounted and bonded, according to this embodiment when viewed from a side direction of the semiconductor chip. Reference numeral 105 denotes a lead portion; 106, a semiconductor chip; 107, leads of a TAB tape; 107a, an inner lead portion of each of the leads 107; and 108, support films of the TAB tape. Referring to FIG. 2, pads 106a arranged on the upper surface of the semiconductor chip 106 are connected to the inner lead portions 107a of the lead 107 of the TAB tape, respectively, and then the semiconductor chip 106 is mounted on the stage portion 101 of the lead frame. The outer lead portions 107b of the leads 107 are connected to the bonding portion of the inner lead portion of the lead portion 105 of the lead frame and the bonding portion of the support portion 102 (ground lead), respectively.

Figure 5:
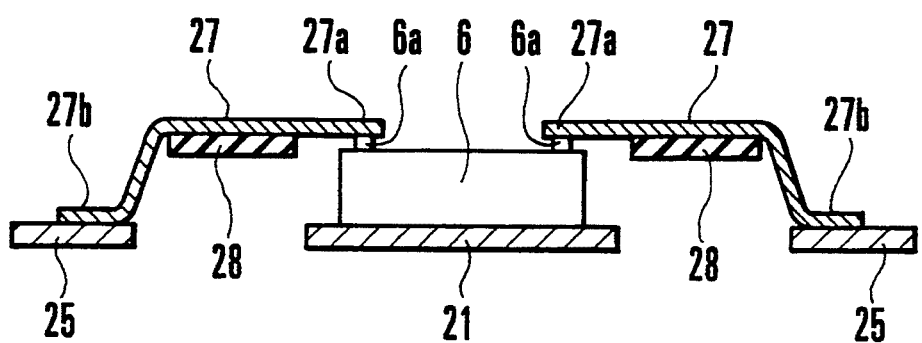
FIG. 5 is a sectional view showing a main part of the lead frame, shown in FIG. 4, on which a semiconductor chip is mounted when viewed from a side direction of the semiconductor chip.
Figure 6:
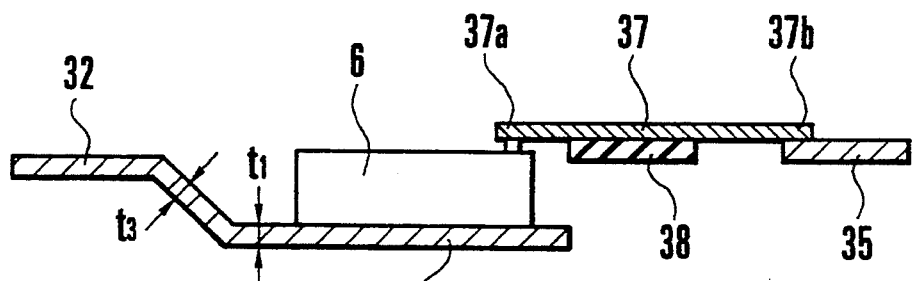
FIG. 6 is a sectional view showing a main part of the conventional lead frame when viewed from a side direction of the semiconductor chip.
Figure 7:
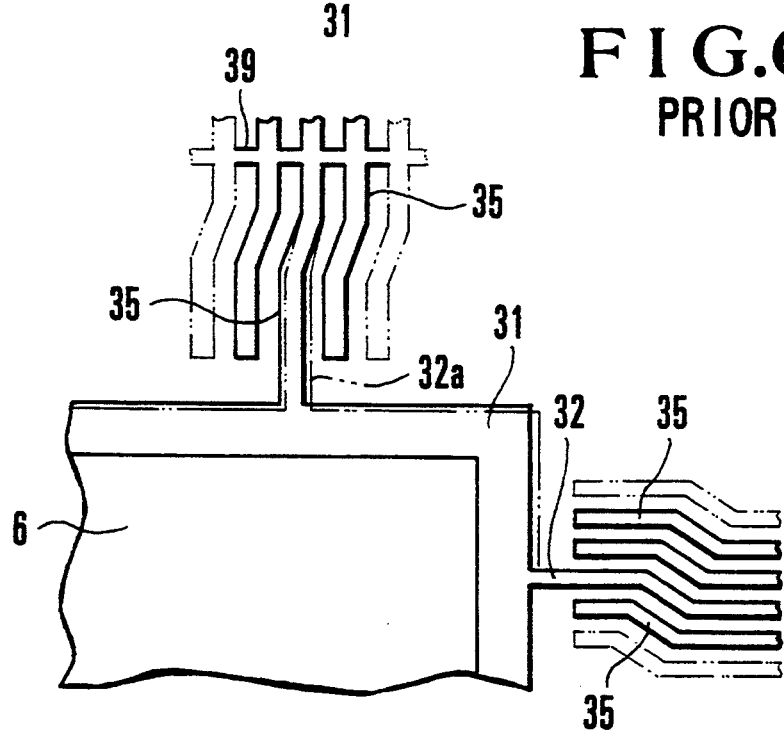
FIG. 7 is a plan view showing the main part of the lead frame in FIG. 6.

In this case, each of the outer lead portions 107b of the leads 107 is slightly bent downward by an amount corresponding to the thickness of the support film 108. For this reason, an amount of bending the outer lead portion 107b is considerably small in comparison with a case wherein the outer lead portion 27b is bent downward by an amount corresponding to the thickness of the semiconductor chip 6 as shown in FIG. 5, and a positional error caused by bending the outer lead portions 107b does not occur. Therefore, the outer lead portions 107b can be accurately positioned, and simultaneous bonding can be easily performed. Note that, when a TAB tape in which the support film 108 is formed on the upper surfaces of the leads 107 is used, the outer lead portions 107b can be used straight without being bent.

The semiconductor chip 106, the leads 107 of the TAB tape, the lead portion 105, and the like which are shown in FIG. 2 are sealed with a resin. In this case, since the sealing resin can flow from the slit-like cut portion 104 and the gap between the connection portion 103 and the stage portion 101 into the periphery of the stage portion 101 as indicated by an arrow A in FIG. 2, the sealing resin can flow at a high speed. In addition, the adhesion property between the sealing resin and the stage portion 101 can be improved, thereby preventing the sealing resin from being peeled from the stage portion 101.

Note that, although only one support portion 102 has been described in the above embodiment, a plurality of support portions 102 are formed in a multi-pin lead frame. For example, since forty support portions 102 are formed in a lead frame having three hundred pins, the stage portion 101 is supported by the support portions 102 at the periphery thereof through connection portions 103 in the same manner as described above.

Figure 3A:
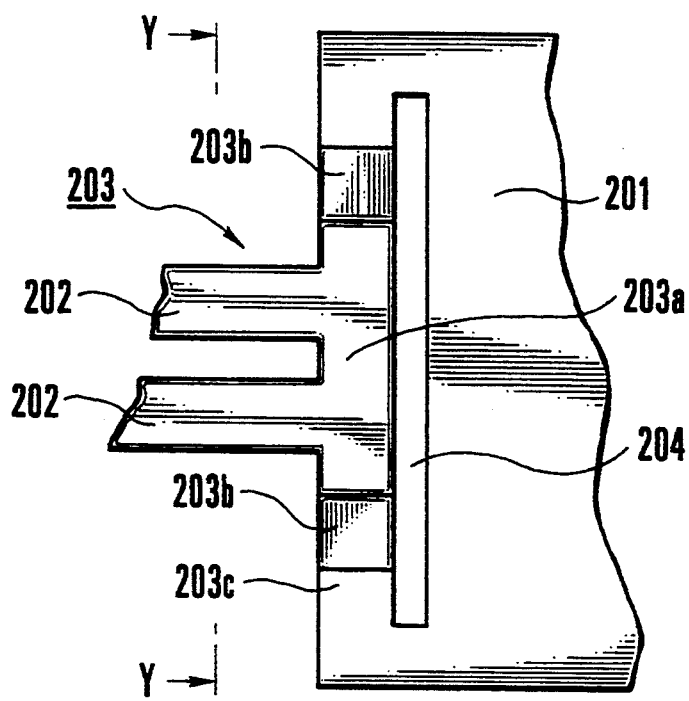
FIG. 3A is a plan view showing a connection portion of a lead frame according to another embodiment of the present invention.
Figure 3B:
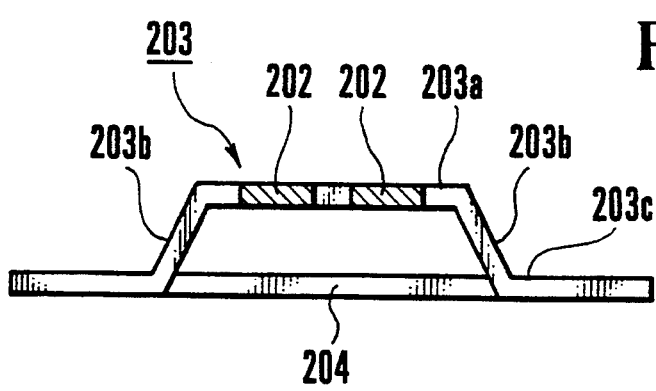
FIG. 3B is a sectional view showing the connection portion along a Y—Y line in FIG. 3A.
Figure 4:
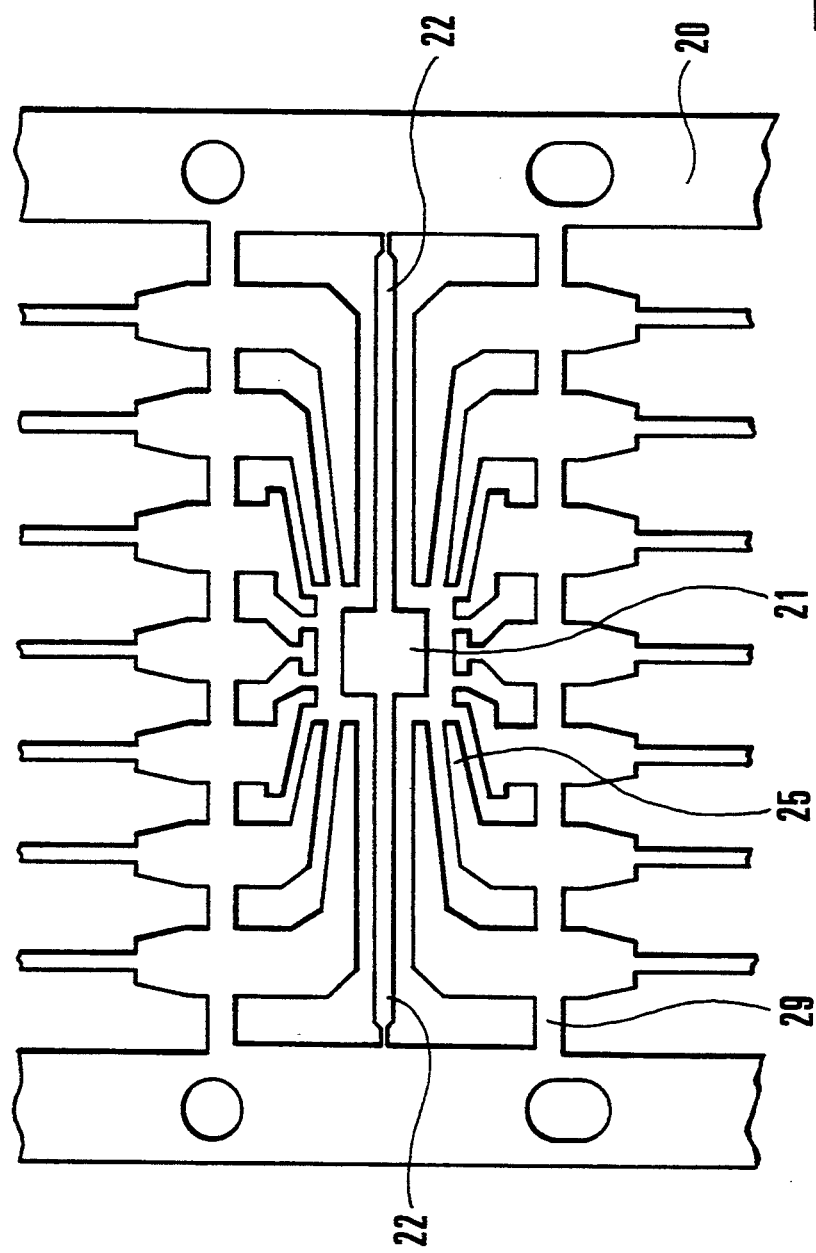
FIG. 4 is a plan view showing a portion corresponding to one semiconductor chip of a conventional lead frame.

FIG. 3A shows a connection portion of a lead frame according to another embodiment of the present invention, and FIG. 3B shows the connection portion along a Y—Y line in FIG. 3A. Reference numeral 201 denotes a stage portion; 202, two support portions of this embodiment; 203, a connection portion; 203a, an upper side portion of the connection portion 203 connected to the end portions of the two support portions 202; 203b, oblique side portions of the connection portion 203; 203c, bottom side portions of the connection portion 203; and 204, a cut portion. According to this embodiment, when the plurality of support portions 202 are arranged adjacent to each other, these support portions 202 are connected to the upper side portion 203a of the connection portion 203 together to support the stage portion 201.

Note that, although the oblique side portions 103b and 203b of the connection portions 103 and 203 have linear shapes in the above embodiments, the shapes of the oblique side portions which are curved to have an arc when viewed from a side surface of the oblique side portions are incorporated in trapezoids defined as the shapes of the connection portions in the present invention.

According to the present invention, the stage portion is arranged at a level lower than that of the arrangement surface of the lead portions without bending the support portions, for supporting the stage portion, downward, and horizontal positional errors of the stage portion and the support portions can be prevented. For this reason, when the pads of a semiconductor chip mounted on the stage portion are to be connected to the support portions (ground leads) and the lead portions, simultaneous bonding can be easily performed using a TAB tape, and efficiency of a bonding operation can be improved.

Since no horizontal positional error occurs in the support portions, the support portions are prevented from being brought into contact with lead portions adjacent to the support portions.

What is claimed is:

1. A lead frame comprising:
   a stage portion on which a semiconductor chip having pads formed on an upper surface of said semiconductor chip is mounted;
   at least one bar-like support portion for supporting said stage portion;
   a plurality of lead portions arranged to surround said stage portion and connected to said pads of said semiconductor chip mounted on said stage portion, said stage portion being arranged at a level lower than that of an arrangement surface of said lead portions; and
   a connection portion formed on one side of said stage portion perpendicular to said bar-like support portion, said connection portion having a central portion which has an upper side portion projecting almost parallelly to a surface of said stage portion at a level higher than that of the surface of said stage portion and is connected to said bar-like support portion on the same plane.

2. A lead frame according to claim 1, wherein said connection portion has a pair of oblique portions for obliquely supporting both ends of said upper side portion from said stage portion.

3. A lead frame according to claim 1, wherein said connection portion is formed in a trapezoidal shape when viewed from a side surface of said connection portion.

4. A lead frame according to claim 1, wherein a slit-like cut portion formed along said connection portion is formed between said connection portion and said stage portion.

5. A lead frame according to claim 1, wherein a plurality of pairs of support portions and connection portions are arranged, and said stage portion is supported by said support portions at a periphery thereof through said connection portions.

6. A lead frame according to claim 1, wherein support portions are parallelly arranged adjacent to each other, and said plurality of support portions are connected to said upper side portion of said connection portion.

7. A lead frame according to claim 1, wherein the semiconductor chip mounted on the stage portion is sealed by a sealing resin which flows from a gap between the connection portion and the stage portion.

* * * * *

UNITED STATES PATENT AND TRADEMARK OFFICE
CERTIFICATE OF CORRECTION

PATENT NO. : 5,389,818
DATED : February 14, 1995
INVENTOR(S) : Inoue et al.

It is certified that error appears in the above-identified patent and that said Letters Patent is hereby corrected as shown below:

In column 7 at line 22 insert --, wherein said at least one bar-like support portion is at a level higher than a level of the stage portion and defines a plane hereby-- following "portion" and prior to ";"

In column 7 at lines 31-32 delete "perpendicular to said bar-like suport portion"

In column 8 at line 5 delete "same plane" and insert --bar-like support portion, wherein the central portion is perpendicular to the bar-like support portion in the plane of the bar-like support portion"

Signed and Sealed this

Thirty-first Day of December, 1996

Attest:

BRUCE LEHMAN

*Attesting Officer*      *Commissioner of Patents and Trademarks*